(12) United States Patent
Noguchi et al.

(10) Patent No.: US 12,356,696 B2
(45) Date of Patent: Jul. 8, 2025

(54) SILICON CARBIDE SEMICONDUCTOR DEVICE, POWER CONVERTER, AND METHOD FOR MANUFACTURING SILICON CARBIDE SEMICONDUCTOR DEVICE

(71) Applicant: Mitsubishi Electric Corporation, Tokyo (JP)

(72) Inventors: Tomoaki Noguchi, Tokyo (JP); Yosuke Nakanishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 365 days.

(21) Appl. No.: 17/477,791

(22) Filed: Sep. 17, 2021

(65) Prior Publication Data

US 2022/0149173 A1 May 12, 2022

(30) Foreign Application Priority Data

Nov. 12, 2020 (JP) .................................. 2020-188705

(51) Int. Cl.
*H10D 64/62* (2025.01)
*H01L 21/04* (2006.01)
(Continued)

(52) U.S. Cl.
CPC ......... *H10D 64/62* (2025.01); *H01L 21/0485* (2013.01); *H02P 27/08* (2013.01);
(Continued)

(58) Field of Classification Search
None
See application file for complete search history.

(56) References Cited

U.S. PATENT DOCUMENTS

2012/0132912 A1  5/2012 Suekawa et al.
2012/0286288 A1* 11/2012 Hussein .............. H01L 27/0207
257/E27.06
(Continued)

FOREIGN PATENT DOCUMENTS

JP     2012-129503 A    7/2012
JP     2015-109474 A    6/2015
(Continued)

OTHER PUBLICATIONS

Machine Translation of KR 20120052076 A, 2012.*
(Continued)

*Primary Examiner* — Sue A Purvis
*Assistant Examiner* — Carnell Hunter, III
(74) *Attorney, Agent, or Firm* — Studebaker Brackett PLLC

(57) ABSTRACT

The object of a silicon carbide semiconductor device according to the present disclosure is to prevent fluctuations in threshold voltage and prevent cracks in a barrier metal. A silicon carbide semiconductor device includes: a silicon carbide substrate; a semiconductor layer formed on the silicon carbide substrate; a gate electrode facing the semiconductor layer through a gate insulating film; an interlayer insulating film covering the gate electrode; a barrier metal formed on the interlayer insulating film; and a top electrode covering the barrier metal, wherein the barrier metal has a two-layer structure of a barrier metal and a barrier metal, and the barrier metal closer to the interlayer insulating film is made of a same metallic material as the barrier metal, the barrier metal being thinner than the barrier metal.

13 Claims, 15 Drawing Sheets

(51) Int. Cl.
  *H02P 27/08* (2006.01)
  *H10D 12/01* (2025.01)
  *H10D 30/66* (2025.01)
  *H10D 62/832* (2025.01)

(52) U.S. Cl.
  CPC ......... *H10D 12/031* (2025.01); *H10D 30/669* (2025.01); *H10D 62/8325* (2025.01)

(56) References Cited

U.S. PATENT DOCUMENTS

| | | | |
|---|---|---|---|
| 2017/0194438 A1* | 7/2017 | Kumagai | H01L 29/1095 |
| 2017/0207174 A1* | 7/2017 | Hoshi | H01L 21/0485 |
| 2017/0271468 A1* | 9/2017 | Iwaya | H01L 29/45 |
| 2018/0294350 A1 | 10/2018 | Utsumi et al. | |
| 2019/0013385 A1* | 1/2019 | Kagawa | H01L 29/66068 |
| 2020/0091299 A1* | 3/2020 | Nakamata | H01L 21/02458 |
| 2021/0166984 A1 | 6/2021 | Yokogawa et al. | |

FOREIGN PATENT DOCUMENTS

| | | | | |
|---|---|---|---|---|
| JP | 2017-168687 A | | 9/2017 | |
| JP | 2018-182032 A | | 11/2018 | |
| JP | 2020-047676 A | | 3/2020 | |
| KR | 20120052076 A | * | 5/2012 | ....... H01L 29/66666 |
| WO | 2019/208755 A1 | | 10/2019 | |
| WO | WO-2023000481 A1 | * | 1/2023 | ....... H01L 21/76832 |

OTHER PUBLICATIONS

Machine Translation of WO 2023000481 A1, 2023.*
An Office Action; "Notice of Reasons for Refusal," mailed by the Japanese Patent Office on Nov. 14, 2023, which corresponds to Japanese Patent Application No. 2020-188705 and is related to U.S. Appl. No. 17/477,791; with English language translation.
An Office Action mailed by The State Intellectual Property Office of People's Republic of China on Sep. 24, 2024, which corresponds to Chinese Patent Application No. 202111305821.2 and is related to U.S. Appl. No. 17/477,791; with English translation.
An Office Action mailed by The State Intellectual Property Office of People's Republic of China on Mar. 31, 2025, which corresponds to Chinese Patent Application No. 202111305821.2 and is related to U.S. Appl. No. 17/477,791; with English translation.

* cited by examiner

F I G. 1
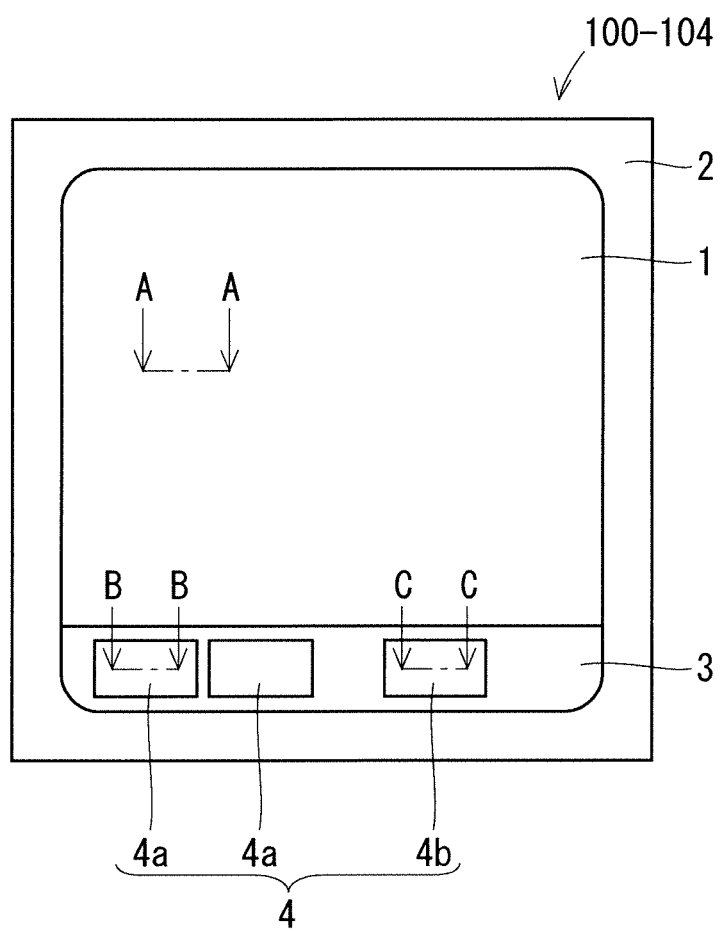

SILICON CARBIDE SEMICONDUCTOR DEVICE, POWER CONVERTER, AND METHOD FOR MANUFACTURING SILICON CARBIDE SEMICONDUCTOR DEVICE

BACKGROUND OF THE INVENTION

Field of the Invention

The present disclosure relates to a silicon carbide semiconductor device.

Description of the Background Art

Conventional silicon carbide semiconductor devices include a barrier metal for preventing diffusion of a metallic material contained in an electrode (e.g., Japanese Patent Application Laid-Open No. 2018-182032). It is preferred that a single-layered barrier metal is thicker to prevent fluctuations in threshold voltage (e.g., paragraph 0021 of Japanese Patent Application Laid-Open No. 2012-129503) and that the single-layered barrier metal is 100 nm thick or more.

However, the problem is that as the single-layered barrier metal is thicker, the barrier metal or an interlayer insulating film is more prone to cracks due to the effect of internal stress in the barrier metal in a machining process or a current-application screening process after forming the barrier metal. Once the cracks occur, a local portion that cannot be protected by the barrier metal appears. Thus, the threshold voltage fluctuates.

The fifth embodiment of Japanese Patent Application Laid-Open No. 2012-129503 describes that the barrier metal has a two-layer structure of a TiSi layer and a Ti layer. However, when the barrier metal has the two-layer structure using different materials, thermal stress caused by a difference in coefficient of thermal expansion is applied between the first and second layers. This leads to a growing concern about cracks.

SUMMARY

The object of a silicon carbide semiconductor device according to a technology of the present disclosure is to prevent fluctuations in threshold voltage and prevent cracks in a barrier metal.

The silicon carbide semiconductor device according to the present disclosure includes a silicon carbide substrate, a semiconductor layer, a gate electrode, an interlayer insulating film, a barrier metal, and a top electrode. The semiconductor layer is formed on the silicon carbide substrate. The gate electrode faces the semiconductor layer through a gate insulating film. The interlayer insulating film covers the gate electrode. The barrier metal is formed on the interlayer insulating film. The top electrode covers the barrier metal. The barrier metal has a two-layer structure of a first barrier metal and a second barrier metal. The first barrier metal closer to the interlayer insulating film in the barrier metal is made of a same metallic material as the second barrier metal, the first barrier metal being thinner than the second barrier metal.

In the structure of the silicon carbide semiconductor device according to the present disclosure, the probability of having cracks in the thinner first barrier metal of the lower layer is less than that of the second barrier metal of the upper layer. Even when the second barrier metal of the upper layer has cracks, the first barrier metal of the lower layer prevent the cracks, and prevents propagation of the cracks into the interlayer insulating film. Thus, fluctuations in threshold voltage are prevented. Since the first and second barrier metals are made of the same metallic material, interatomic bonding between the first and second barrier metals is stronger than that when the first and second barrier metals are made of different metallic materials. Thus, even when the first barrier metal is thinner, the strong bonding with the second barrier metal prevents hydrogen ions causing fluctuations in threshold voltage from entering a gate insulating film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 illustrates a plan view of a silicon carbide semiconductor device according to Embodiment 1;

DESCRIPTION OF THE PREFERRED EMBODIMENTS

Figure 2:
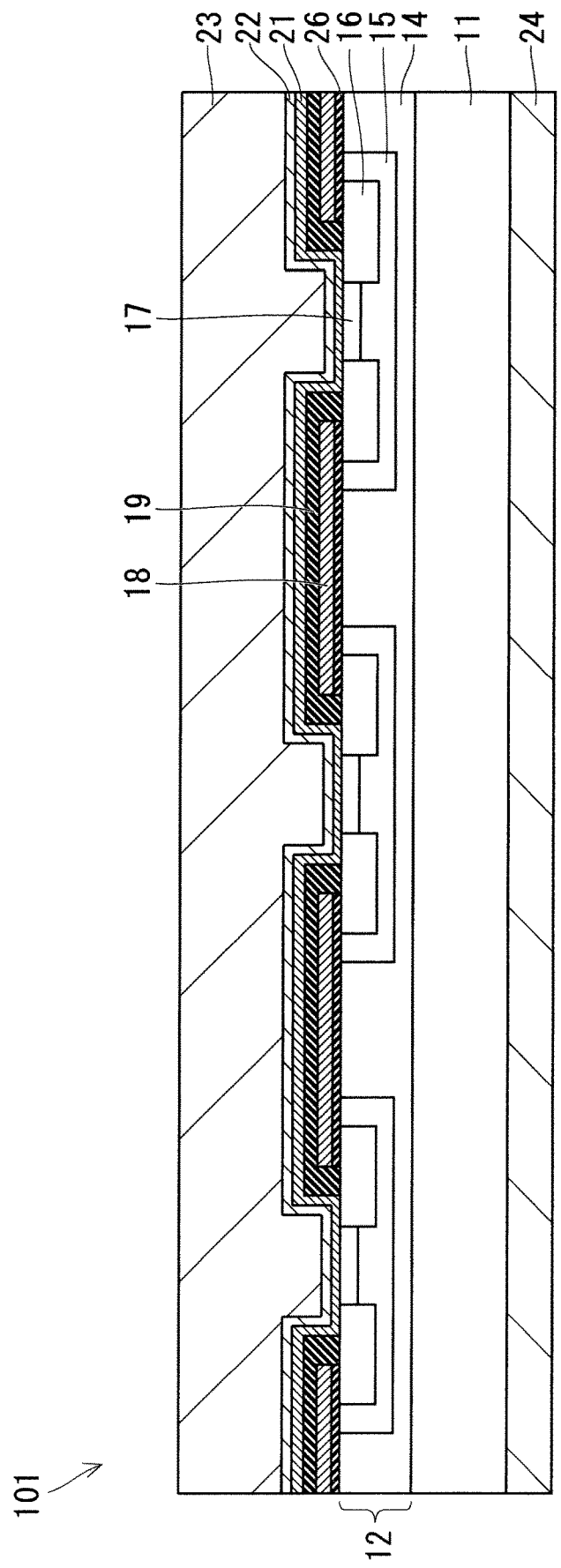
FIG. 2 illustrates a cross-sectional view of a cell region in the silicon carbide semiconductor device according to Embodiment 1.

In this specification, the first conductivity type of a semiconductor is n-type, and the second conductivity type is p-type. Conversely, the first conductivity type may be p-type, and the second conductivity type may be n-type. The expressions of n$^-$ type and n-type indicate that the n-type impurity concentration is lower in this order. In other words, n-type is higher in n-type impurity concentration than n⁻ type. This relationship of impurity concentration applies to the expressions of p⁻ type and p-type on p-type impurity concentration.

A. Embodiment 1

[A-1 Structure]
[A-1-1. Planar Structure]

FIG. 1 illustrates a plan view of a silicon carbide semiconductor device 101 according to Embodiment 1. As illustrated in FIG. 1, the silicon carbide semiconductor device 101 includes a cell region 1, a terminal region 2, and a pad region 3. The plan view of FIG. 1 applies not only to the silicon carbide semiconductor device 101 according to Embodiment 1 but also to semiconductor devices according to other Embodiments and a semiconductor device of a comparative example.

In the following description, the silicon carbide semiconductor device 101 is described as a metal-oxide-semiconductor field-effect transistor (MOSFET).

The cell region 1 is a region in which a semiconductor element structure is formed and which operates as a semiconductor element. When the silicon carbide semiconductor device 101 is a MOSFET, a MOSFET structure is formed in the cell region 1, and the cell region 1 operates as the MOSFET.

The terminal region 2 is formed to enclose the cell region 1 and the pad region 3, and maintains the breakdown voltage of the silicon carbide semiconductor device 101.

The pad region 3 is a region including a control pad 4 for controlling the silicon carbide semiconductor device 101, and is adjacent to the cell region 1. The cell region 1 and the pad region 3 are collectively referred to as an element region.

The control pad 4 includes, for example, current sense pads 4a or a gate pad 4b. The current sense pads 4a are control pads for detecting a current flowing through the cell region 1. The current sense pads 4a are electrically connected to a part of the cell region 1. These allow a fraction to one several ten-thousandth of the current flowing through the entirety of the cell region I to flow through the current sense pads 4a, when the current flows through the cell region 1. The number of the current sense pads 4a may be two or more as illustrated in FIG. 1, or only one. The current sense pads 4a are also collectively referred to as a sense cell region. The gate pad 4b is connected to a gate electrode of the cell region 1, and controls the current flowing through the cell region 1. A region in which the gate pad 4b is formed is also referred to as a gate pad region.

[A-1-2. Cross-Sectional Structure]

Figure 3:
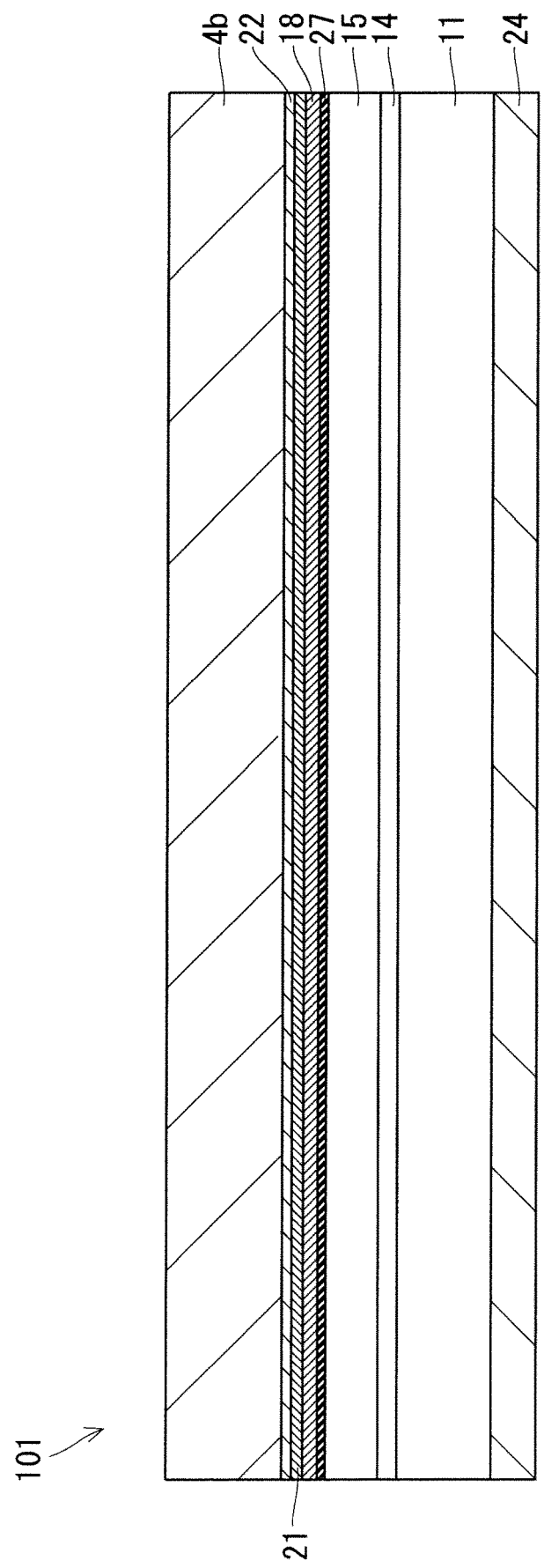
FIG. 3 illustrates a cross-sectional view of a gate pad region in the silicon carbide semiconductor device according to Embodiment 1.

FIGS. 2 and 3 illustrate cross-sectional views of the silicon carbide semiconductor device 101. FIG. 2 illustrates the cross-sectional view of the cell region 1 taken along the line A-A of FIG. 1. The cross-sectional view of the current sense pad 4a taken along the line B-B of FIG. 1 is identical to the one in FIG. 2. In other words, the cell region 1 and the current sense pad 4a have the same cross-sectional structure. FIG. 3 illustrates the cross-sectional view of the gate pad region taken along the line C-C of FIG. 1.

As illustrated in FIG. 2, the silicon carbide semiconductor device 101 includes, in the cell region 1, a silicon carbide substrate 11, a semiconductor layer 12, a gate insulating film 26, a gate electrode 18, barrier metals 21 and 22, a source electrode 23, and a drain electrode 24.

The silicon carbide substrate 11 is of n⁻ type, and has a first substrate principal surface S111 and a second substrate principal surface S112 facing the first substrate principal surface S111.

The semiconductor layer 12 is formed on the first substrate principal surface S111 of the silicon carbide substrate 11, and has a first semiconductor layer principal surface S121 and a second semiconductor layer principal surface S122 facing the first semiconductor layer principal surface S121. The second semiconductor layer principal surface S122 is in contact with the first substrate principal surface S111 of the silicon carbide substrate 11. The semiconductor layer 12 includes an n⁻ type epitaxial layer 14, a plurality of p-type well regions 15, a plurality of n-type source regions 16, and a plurality of p⁺ type contact regions 17.

The epitaxial layer 14 is formed on the first substrate principal surface S111 of the silicon carbide substrate 11.

The plurality of well regions 15 are selectively formed in the surface layer of the epitaxial layer 14 closer to the first semiconductor layer principal surface S121.

Each of the source regions 16 is selectively formed in the surface layer of the well regions 15 that is closer to the first semiconductor layer principal surface S121.

Each of the contact regions 17 is selectively formed in the surface layer of the well regions 15 that is closer to the first semiconductor layer principal surface S121, to be adjacent to the source regions 16. The contact regions 17 need not be formed in the silicon carbide semiconductor device 101.

The surface layer of the well regions 15 is sandwiched between the source regions 16 and the epitaxial layer 14, and operates as a channel region. The gate insulating film 26 is formed above this channel region.

The gate electrode 18 is formed on the gate insulating film 26. The gate electrode 18 faces the channel region of the well regions 15 through the gate insulating film 26.

An interlayer insulating film 19 is formed to cover the gate electrode 18. The interlayer insulating film 19 is a thermal oxide film. The interlayer insulating film 19 includes contact holes 19h exposing the source regions 16 and the contact regions 17.

The barrier metal 21 is formed in the contact holes 19h and on the interlayer insulating film 19. The barrier metal 21 is in contact with the source regions 16 and the contact regions 17 in the contact holes 19h.

The barrier metal 22 is formed on the barrier metal 21. In other words, the silicon carbide semiconductor device 101 has two layers of the barrier metals consisting of the barrier metal 21 as a lower layer and the barrier metal 22 as an upper layer. The barrier metal 21 is also referred to as a first barrier metal, and the barrier metal 22 is also referred to as a second barrier metal. The barrier metals 21 and 22 are made of the same metallic material. Preferably, the barrier metal 21 is 100 nm thick or less to prevent fluctuations in threshold voltage and prevent cracks. Preferably, the barrier metal 22 is thicker than the barrier metal 21, and is 100 nm thick or less to prevent fluctuations in threshold voltage and prevent cracks. The total thickness of the barrier metals 21 and 22 ranges between 100 nm and 200 nm.

The source electrode 23 is formed on the barrier metal 22, and is in contact with the source regions 16 and the contact regions 17 through the barrier metals 21 and 22. The source electrode 23 is an example of a top electrode.

The drain electrode 24 is formed on the second substrate principal surface S112 of the silicon carbide substrate 11. The drain electrode 24 is an example of a bottom electrode.

As illustrated in FIG. 3, a field oxide film 27 is formed on the upper surface of the well region 15, and the gate electrode 18 extends over the field oxide film 27 in the gate pad region. In the gate pad region, the interlayer insulating film 19 is removed to expose the gate electrode 18. The barrier metals 21 and 22 are deposited on the upper surface of the exposed gate electrode 18. Then, the gate pad 4b is formed on the barrier metals 21 and 22. Although the source electrode 23 and the gate pad 4b are formed in the same process, patterning the source electrode 23 and the gate pad 4b together with the barrier metals 21 and 22 electrically isolate the source electrode 23 from the gate pad 4b.

[A-2. Manufacturing Processes]

Figure 4:
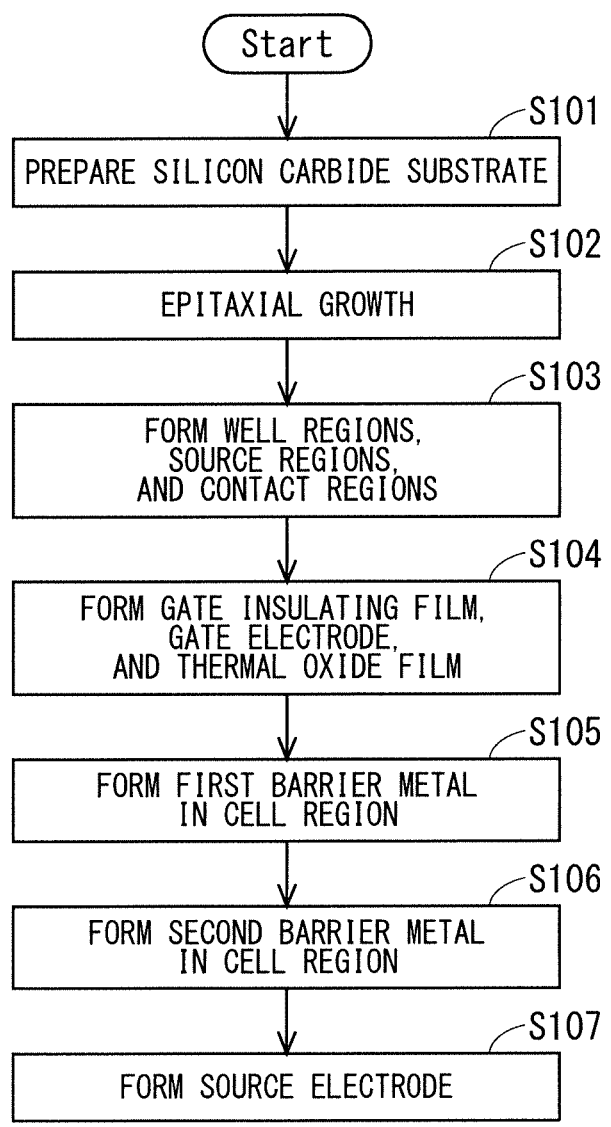
FIG. 4 is a flowchart illustrating manufacturing processes of the silicon carbide semiconductor device according to Embodiment 1.

FIG. 4 is a flowchart illustrating manufacturing processes of the silicon carbide semiconductor device 101. FIGS. 5 to 8 illustrate cross-sectional views of the manufacturing processes of the silicon carbide semiconductor device 101. Hereinafter, the manufacturing processes of the silicon carbide semiconductor device 101 will be described using the flowchart in FIG. 4 with reference to FIGS. 5 to 8. FIGS. 5 to 8 correspond to the cross-sectional view taken along the line A-A or the line B-B in FIG. 1, and do not illustrate the gate pad region or the terminal region 2. The barrier metals 21 and 22 in the gate pad region are deposited in the same method as the barrier metals 21 and 22 in the cell region 1 and the current sense pads 4a. The structure of the gate pad region except for the barrier metals 21 and 22 is created in a known manufacturing method. The terminal region 2 is also formed in the known manufacturing method.

First, the silicon carbide substrate 11 is prepared (Step S101).

Figure 5:
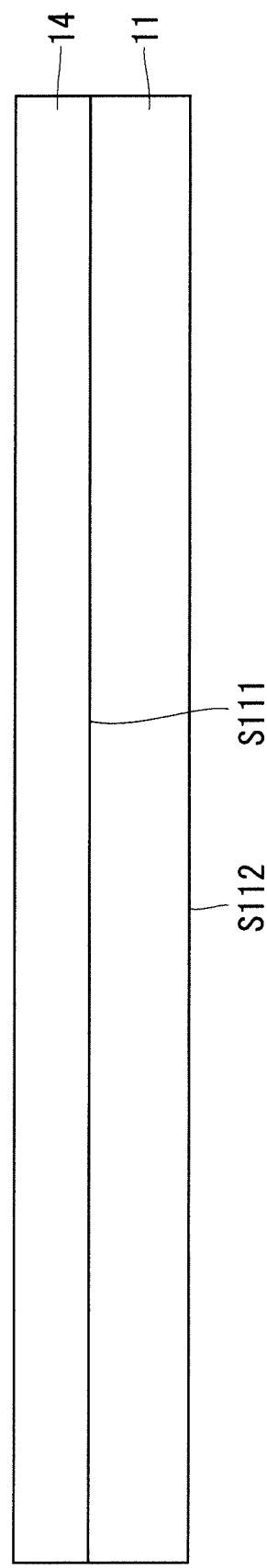
FIG. 5 illustrates a cross-sectional view of a manufacturing process of the silicon carbide semiconductor device according to Embodiment 1.

Next, the epitaxial layer 14 is formed through epitaxial growth on the first substrate principal surface S111 of the silicon carbide substrate 11 (Step S102). Here, concentrations of n-type impurities contained in the silicon carbide substrate 11 and the epitaxial layer 14 are appropriately selected according to a breakdown voltage of a semiconductor device to be manufactured. Thereby, the structure in FIG. 5 is obtained.

Next, ions of p-type impurities and n-type impurities are implanted from the upper surface of the epitaxial layer 14 and diffused into the epitaxial layer 14 through, for example, a thermal process to form the well regions 15, the source regions 16, and the contact regions 17 in the cell region 1 and the current sense pads 4a (Step S103).

Specifically, a mask process is applied on the upper surface of the epitaxial layer 14. The mask process is to apply a resist and form an opening in a predetermined region of the resist through photolithography. P-type impurities such as boron (B) are implanted into the epitaxial layer 14 through the opening of the resist. Diffusion of the p-type impurities in the thermal process forms the plurality of well regions 15. The plurality of well regions 15 are selectively formed in the upper surface of the epitaxial layer 14.

The formed depth and the p-type impurity concentration may be consistent among the plurality of well regions 15. Since this merely requires implanting ions for forming the plurality of well regions 15 once, the productivity of the silicon carbide semiconductor device 101 can be improved. Furthermore, the consistent depth of the plurality of well regions 15 can relax the electric field concentration and suppress decrease in the breakdown voltage. The formed depth and the p-type impurity concentration of the plurality of well regions 15 may vary through implanting ions a plurality of times.

Next, the mask process is applied on the upper surface of the epitaxial layer 14 and the well regions 15, and n-type impurities are implanted into the well regions 15 through the opening of the resist. Examples of the n-type impurities to be implanted include arsenic (As) and phosphorus (P). Diffusion of the n-type impurities into the well regions 15 in the thermal process forms the source regions 16. The source regions 16 are selectively formed in the surface layer of the well regions 15.

Figure 6:
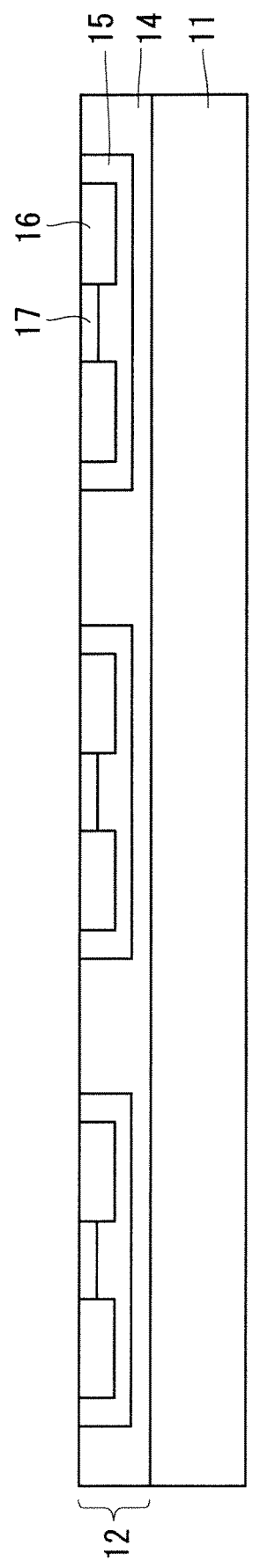
FIG. 6 illustrates a cross-sectional view of a manufacturing process of the silicon carbide semiconductor device according to Embodiment 1.

Then, the mask process is applied on the upper surface of the epitaxial layer 14, and the p-type impurities such as boron are implanted into the well regions 15 through the opening of the resist. Diffusion of the p-type impurities in the thermal process forms the $p^+$ type contact regions 17. Each of the contact regions 17 is selectively formed in the surface layer of the well regions 15 to be adjacent to the source regions 16. As such, the semiconductor layer 12 including the epitaxial layer 14, the well regions 15, the source regions 16, and the contact regions 17 is formed, and the structure in FIG. 6 is obtained.

Next, the gate insulating film 26, the gate electrode 18, and the interlayer insulating film 19 are formed in the cell region 1 and the current sense pads 4a (Step S104). Specifically, a wafer is heated in an atmosphere containing oxygen to form the gate insulating film 26 made of $SiO_2$ on the upper surface of the semiconductor layer 12. Then, polysilicon doped with n-type or p-type impurities is deposited on the gate insulating film 26 by, for example, chemical vapor deposition (CVD) to form the gate electrode 18.

Figure 7:
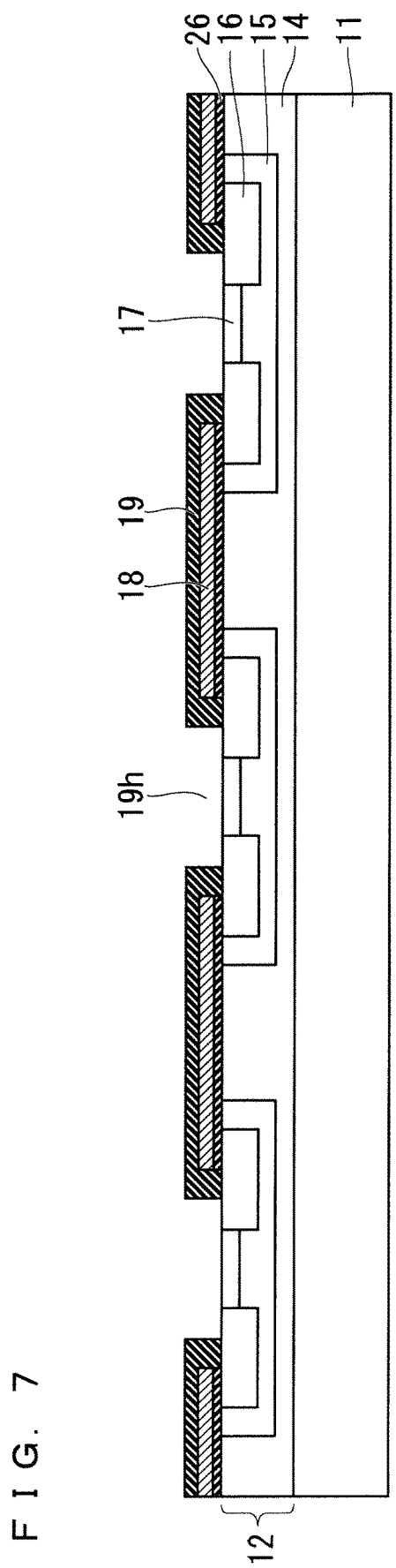
FIG. 7 illustrates a cross-sectional view of a manufacturing process of the silicon carbide semiconductor device according to Embodiment 1.

Then, the interlayer insulating film 19 is formed on the gate electrode 18. The interlayer insulating film 19 is made of, for example, $SiO_2$ or tetraethyl orthosilicate (TEOS). Next, the mask process is applied on the upper surface of the interlayer insulating film 19 to etch a part of the interlayer insulating film 19 through the opening of the resist. Thereby, the contact holes 19h are formed on the interlayer insulating film 19 as illustrated in FIG. 7. The contact holes 19h are formed on the well regions 15 and the contact regions 17.

Next, the barrier metal 21 is formed in the contact holes 19h of the interlayer insulating film 19 and on the interlayer insulating film 19 in the cell region 1 (Step S105). The barrier metal 21 is formed by depositing a film of titanium (Ti) by physical vapor deposition (PVD) or CVD.

Figure 8:
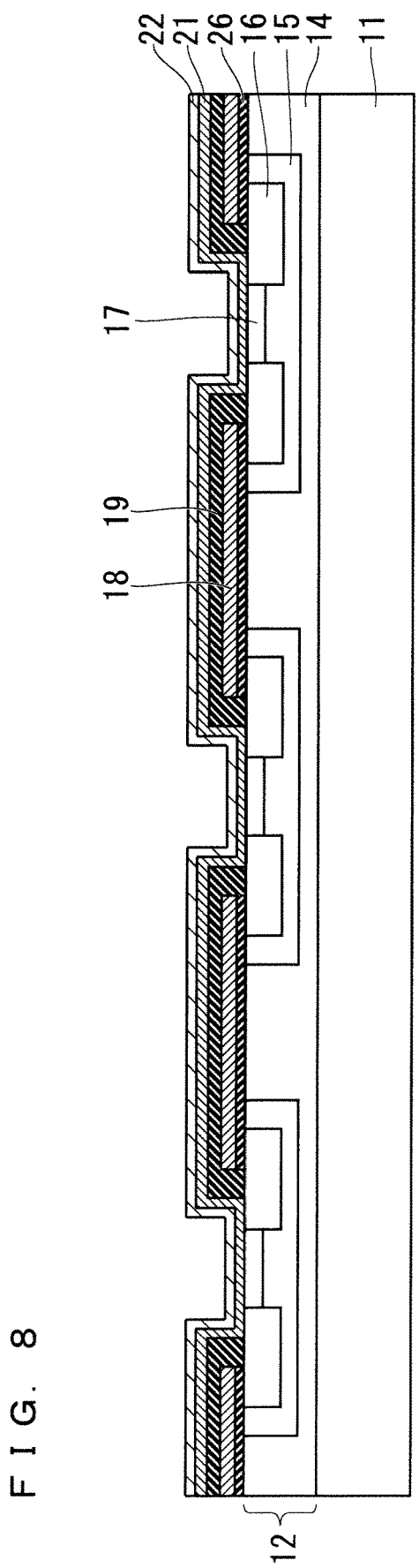
FIG. 8 illustrates a cross-sectional view of a manufacturing process of the silicon carbide semiconductor device according to Embodiment 1.

After the barrier metal 21 is formed, a film of titanium (Ti) is continuously deposited by physical vapor deposition (PVD) or CVD without exposing the wafer to atmosphere. Thereby, the barrier metal 22 is formed on the barrier metal 21 in the cell region 1 (Step S106). Here, the barrier metal 22 is formed thicker than the barrier metal 21. Thereby, the structure in FIG. 8 is obtained.

Next, the source electrode 23 is formed on the barrier metal 22 (Step S107). The source electrode 23 is formed by, for example, depositing an alloy of aluminum and silicon (Al—Si alloys) on the barrier metal 22 by sputtering or vapor deposition such as PVD. Further, a nickel alloy (Ni alloy) may be formed on the alloy of aluminum and silicon by electroless plating or electroplating. Then, combining the alloy of aluminum and silicon with the nickel alloy may form the source electrode 23. The source electrode 23 can be easily formed by plating a thick metal film. This increases the thermal capacity of the source electrode 23, and thereby improves the heat resistance. The nickel alloy may be formed by plating, after forming the drain electrode 24 to be described later.

Next, the drain electrode 24 is formed on the second substrate principal surface S112 of the silicon carbide substrate 11. The drain electrode 24 is formed across the cell region 1 and the terminal region 2. The drain electrode 24 is formed by, for example, depositing the alloy of aluminum and silicon or titanium by sputtering or vapor deposition such as PVD. The drain electrode 24 may be formed by laminating a plurality of metals including the alloy of aluminum and silicon, titanium, nickel, and gold. The drain electrode 24 may be formed by further forming, on a metal film formed by PVD, a metal film by electroless plating or electroplating, and combining the metal film formed by the plating with the metal film formed by PVD. Thereby, the structure in FIG. 2 is obtained.

Since a plurality of the silicon carbide semiconductor devices 101 are formed in a matrix as an n-type wafer, laser dicing or blade dicing the wafer into the silicon carbide semiconductor devices 101 completes the silicon carbide semiconductor devices 101.

[A-3. Modifications]

The metallic material of the barrier metals 21 and 22 is described as Ti above. However, as long as the barrier metals 21 and 22 are made of the same metallic material, not only Ti but also TiN or TiSi produce the same advantages. When the metallic material of the barrier metals 21 and 22 is TiN, the barrier metal 21 is formed by depositing a film of titanium (Ti) by physical vapor deposition (PVD) or CVD and then thermally processing the film under $N_2$ atmosphere. The annealing is performed at a temperature ranging from 500 to 1100° C. for approximately one hour. A native oxide film may be formed on TiN. Then, the barrier metal 22 is formed in the same manner as the barrier metal 21.

[A-4. Advantages]

Figure 9:
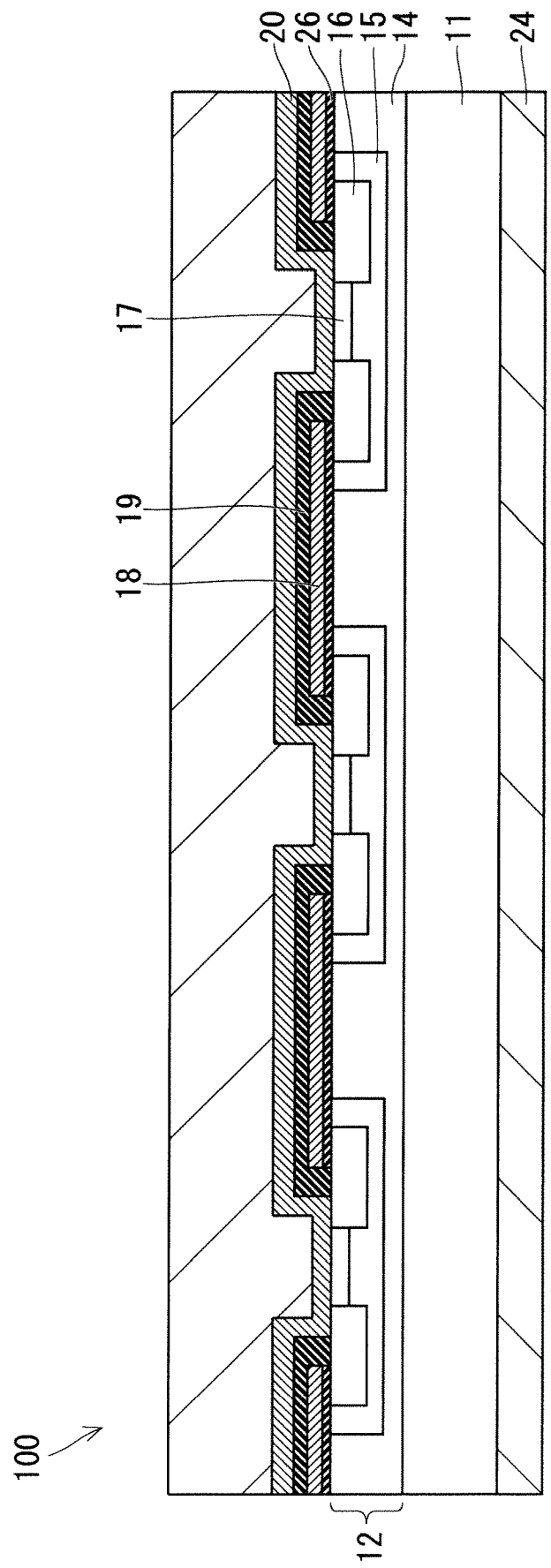
FIG. 9 illustrates a cross-sectional view of a silicon carbide semiconductor device in a comparative example.

FIG. 9 illustrates a cross-sectional view of a silicon carbide semiconductor device 100 including a single-layered barrier metal 20 in a comparative example. Thickening the barrier metal 20 can prevent fluctuations in threshold voltage in the silicon carbide semiconductor device 100. The problem is that as the barrier metal 20 is thicker, the barrier metal 20 or the interlayer insulating film 19 is more prone to cracks due to the effect of internal stress in the barrier metal 20. The causes of the cracks in the barrier metal 20 include the heat generated in the machining process such as dicing cuts for dicing a semiconductor wafer into chips, and thermal stress caused by the heat generated by applying a current in a test for screening out an electrical characteristics failure. Since the cracks locally produce a portion that cannot be protected by the barrier metal 20, the threshold voltage fluctuates.

In contrast, the silicon carbide semiconductor device 101 according to Embodiment 1 includes the two layers of the barrier metals 21 and 22. The barrier metal 21 of the lower layer is thinner than the barrier metal 22 of the upper layer. Specifically, the silicon carbide semiconductor device 101 is segmented into the cell region 1 and the sense cell region adjacent to the cell region 1 in a plan view, and includes: the silicon carbide substrate 11; the semiconductor layer 12 formed on the silicon carbide substrate 11; the gate electrode 18 facing the semiconductor layer 12 through the gate insulating film 26; the interlayer insulating film 19 covering the gate electrode 18; a barrier metal formed on the interlayer insulating film 19; and a top electrode covering the barrier metal, wherein the barrier metal has a two-layer structure of the barrier metal 21 and the barrier metal 22, and the barrier metal 21 closer to the interlayer insulating film 19 in the barrier metal is made of a same metallic material as the barrier metal 22, the barrier metal 21 being thinner than the barrier metal 22.

A method for manufacturing the silicon carbide semiconductor device 101 according to Embodiment 1 includes: preparing the silicon carbide substrate 11; forming the semiconductor layer 12 on the silicon carbide substrate 11; forming the gate electrode 18 facing the semiconductor layer 12 through the gate insulating film 26; forming the interlayer insulating film 19 covering the gate electrode 18; forming the barrier metal 21 on the interlayer insulating film 19; forming the barrier metal 22 made of a same metallic material as the barrier metal 21, the barrier metal 22 being thicker than the barrier metal 21; and forming a top electrode covering the barrier metal 22.

Even when the barrier metal 22 of the upper layer has cracks, the probability of having cracks in the thinner barrier metal 21 of the lower layer is less than that of the barrier metal 22 of the upper layer. Even when the barrier metal 22 of the upper layer has cracks, the barrier metal 21 of the lower layer prevent the cracks, and prevents propagation of the cracks into the interlayer insulating film 19. Thus, fluctuations in threshold voltage are prevented.

Since the barrier metals 21 and 22 are made of the same metallic material, interatomic bonding between the barrier metals 21 and 22 is stronger than that when the barrier metals 21 and 22 are made of different metallic materials. Thus, even when the barrier metal 21 of the first layer is thinner, the strong bonding with the barrier metal 22 of the second layer significantly prevents hydrogen ions causing the fluctuations in threshold voltage from entering the gate insulating film 26. When the barrier metals 21 and 22 are made of different metallic materials, the barrier metals 21 and 22 have different coefficients of thermal expansion, and suffer from thermal stress due to the difference in coefficient of thermal expansion. However, the barrier metals 21 and 22 made of the same metallic material prevent the thermal stress.

The silicon carbide semiconductor device 101 can prevent the fluctuations in threshold voltage and cracks, and improve the productivity.

B. Embodiment 2

[B-1. Structure]

Figure 10:
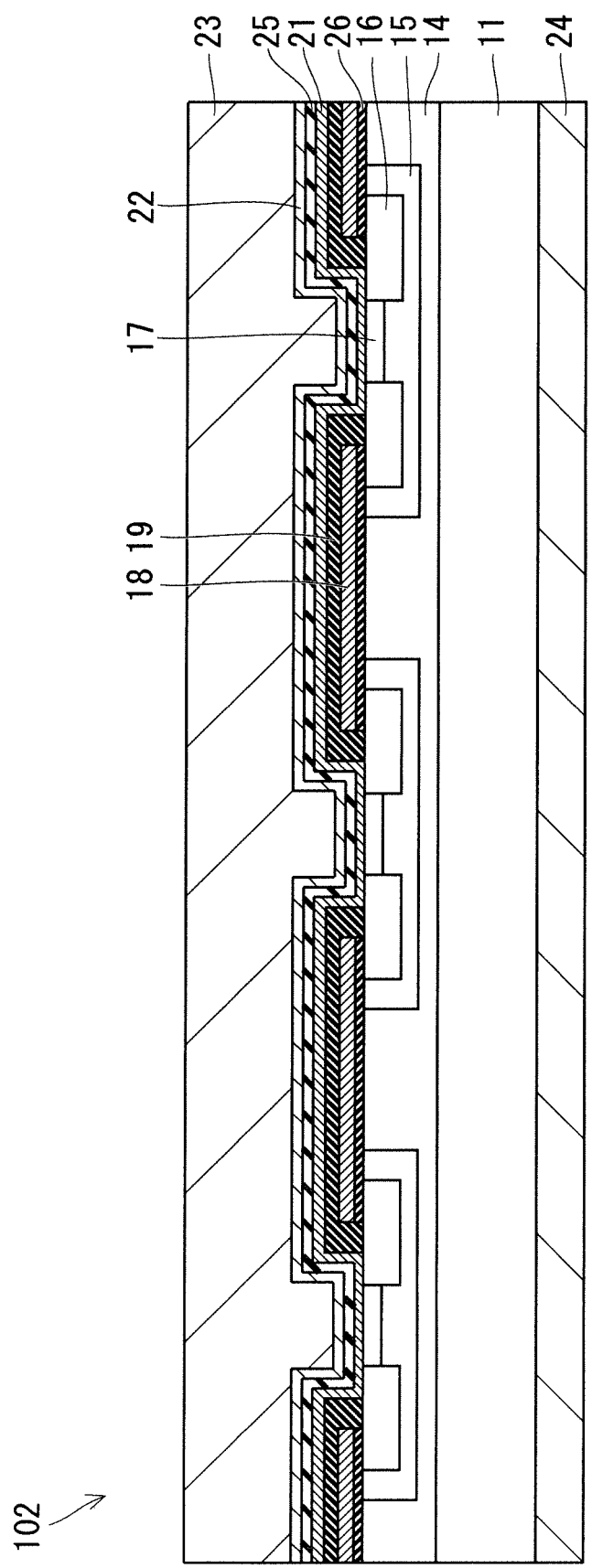
FIG. 10 illustrates a cross-sectional view of a silicon carbide semiconductor device according to Embodiment 2.

FIG. 10 illustrates a cross-sectional view of a structure of a silicon carbide semiconductor device 102 according to Embodiment 2. FIG. 10 illustrates the cross-sectional view taken along the line A-A of FIG. 1. In addition to the structure of the silicon carbide semiconductor device 101 according to Embodiment 1, the silicon carbide semiconductor device 102 includes an oxide film 25 between the barrier metal 21 of the lower layer and the barrier metal 22 of the upper layer. The oxide film 25 is extremely thin, and is approximately 1 Å thick.

[B-2, Manufacturing Processes]

Figure 11:
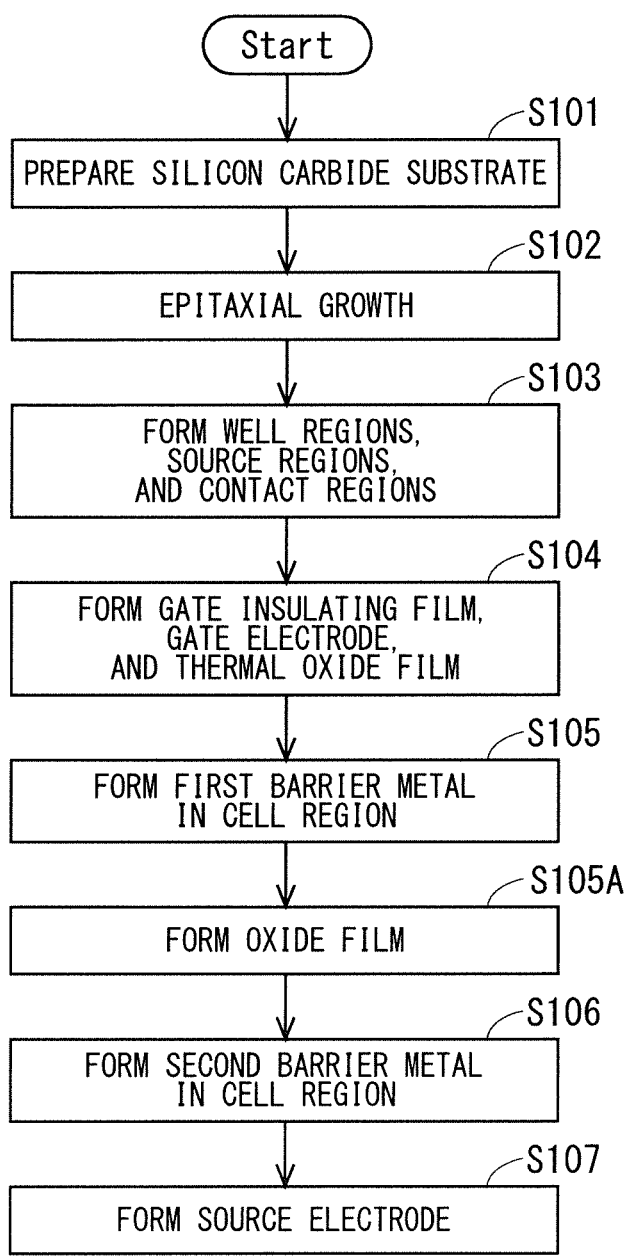
FIG. 11 is a flowchart illustrating manufacturing processes of the silicon carbide semiconductor device according to Embodiment 2.

FIG. 11 is a flowchart illustrating manufacturing processes of the silicon carbide semiconductor device 102 according to Embodiment 2. The manufacturing processes of the silicon carbide semiconductor device 102 according to Embodiment 2 will be described.

The processes until forming the barrier metal 21 of the lower layer (Steps S101 to S105) are identical to those according to Embodiment 1.

After the barrier metal 21 of the lower layer is formed, unloading the wafer and naturally oxidizing the surface of the barrier metal 21 made of Ti produces the oxide film 25 that is approximately 1 Å thick (Step S105A).

The following Steps S106 and S107 are identical to those according to Embodiment 1.

[B-3. Advantages]

In addition to the structure of the silicon carbide semiconductor device 101 according to Embodiment 1, the silicon carbide semiconductor device 102 includes the oxide film 25 between the barrier metal 21 and the barrier metal 22. A method for manufacturing the silicon carbide semiconductor device 102 includes forming the oxide film 25 on the barrier metal 21, and forming the barrier metal 22 on the barrier metal 21 through the oxide film 25. The oxide film 25 prevents the cracks produced in the barrier metal 22 of the upper layer from reaching the barrier metal 21 of the lower layer, and prevents hydrogen ions causing the fluctuations in threshold voltage from entering the gate insulating film 26. Thus, the silicon carbide semiconductor device 102 according to Embodiment 2 can prevent the fluctuations in threshold voltage more than by the silicon carbide semiconductor device 101 according to Embodiment 1.

C. Embodiment 3

[C-1. Structure]

Figure 12:
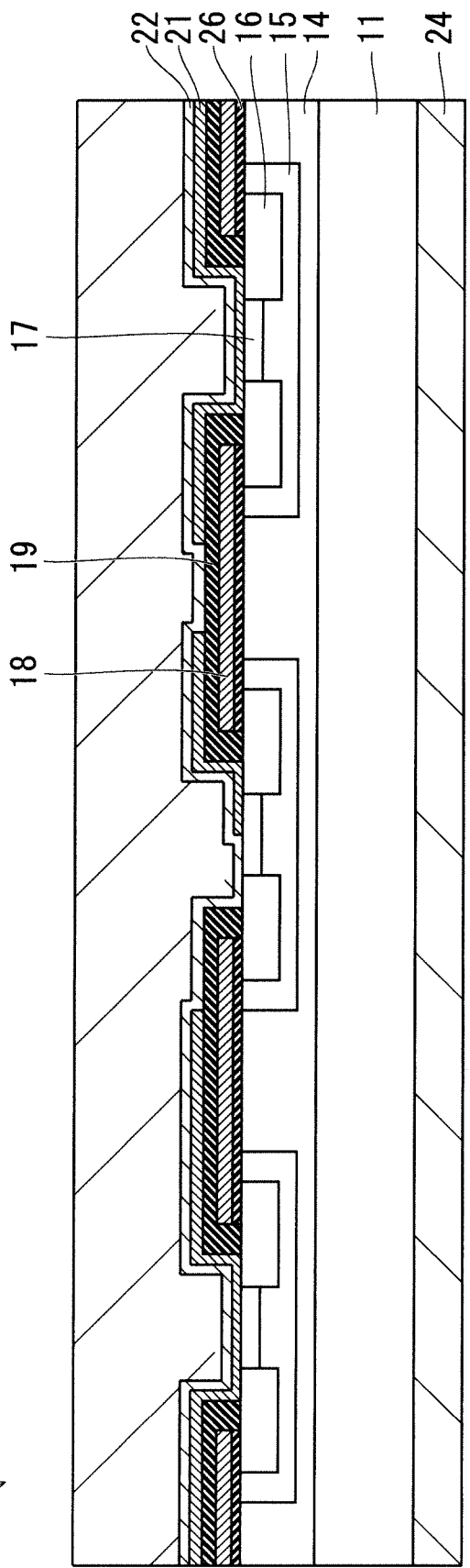
FIG. 12 illustrates a cross-sectional view of a silicon carbide semiconductor device according to Embodiment 3.

FIG. 12 illustrates a cross-sectional view of a structure of a silicon carbide semiconductor device 103 according to Embodiment 3. FIG. 12 illustrates the cross-sectional view taken along the line A-A of FIG. 1. In the silicon carbide semiconductor device 101 according to Embodiment 1, the barrier metal 21 of the lower layer and the barrier metal 22 of the upper layer are formed on the entire region of the interlayer insulating film 19. In contrast, the silicon carbide semiconductor device 103 according to Embodiment 3 is characterized by having steps in the barrier metal 22 of the upper layer, by forming, on partial regions of the interlayer insulating film 19, not the barrier metal 21 of the lower layer but the barrier metal 22 of the upper layer.

[C-2. Manufacturing Processes]

Figure 13:
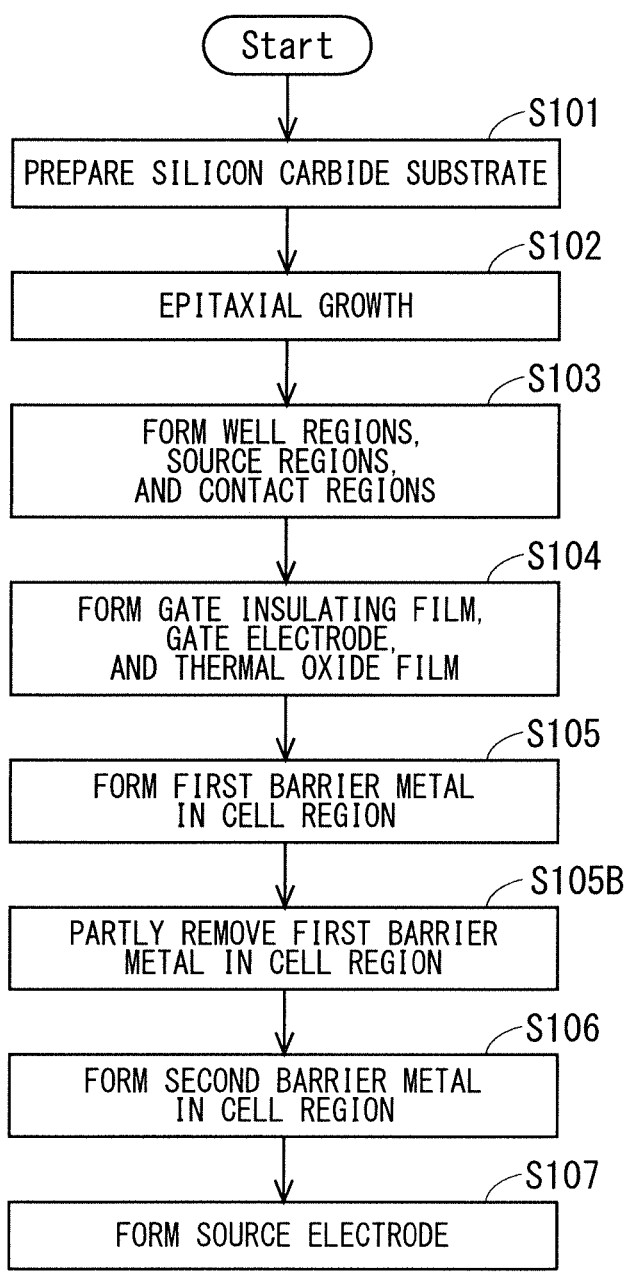
FIG. 13 is a flowchart illustrating manufacturing processes of the silicon carbide semiconductor device according to Embodiment 3.

FIG. 13 is a flowchart illustrating manufacturing processes of the silicon carbide semiconductor device 103 according to Embodiment 3. The manufacturing processes of the silicon carbide semiconductor device 103 according to Embodiment 3 will be described.

The processes until forming the barrier metal 21 of the lower layer (Steps S101 to S105) are identical to those according to Embodiment 1. After the barrier metal 21 of the lower layer is formed, the barrier metal 21 on the partial regions of the interlayer insulating film 19 is removed (Step S105B).

The barrier metal 21 is removed, for example, in the following method. Specifically, a resist pattern is formed on the barrier metal 21 and then the barrier metal 21 is partially etched, through photolithography. Then, the resist is removed to complete the patterning of the barrier metal 21.

The following Steps S106 and S107 are identical to those according to Embodiment 1.

The silicon carbide semiconductor device 103 according to Embodiment 3 may also include the oxide film 25 between the barrier metals 21 and 22, similarly to Embodiment 2. In such a case, Step S105A described in Embodiment 2 is performed between Step S105B and Step S106.

Although FIG. 12 illustrates that the barrier metal 21 of the lower layer is not formed on the partial regions of the interlayer insulating film 19, the barrier metal 22 of the upper layer need not be formed on the partial regions of the interlayer insulating film 19, instead of the barrier metal 21 of the lower layer. In such a case, Step S105B should be replaced with forming the barrier metal 22 of the upper layer similarly to Embodiment 1, and partially etching the barrier metal 22 through photolithography.

Partial removal of the barrier metal 21 through photolithography is described above. However, if a foreign substance adheres to the barrier metal 21 of the lower layer during the manufacturing processes, a liquid scrubbing process may be performed after forming the barrier metal 21 and before forming the barrier metal 22. Since the liquid scrubbing process eliminates the foreign substance and the barrier metal 21 formed on the foreign substance from the interlayer insulating film 19, a part of the barrier metal 21 can be removed without photolithography.

[C-3. Advantages]

The silicon carbide semiconductor device 103 according to Embodiment 3 includes the portions on which the barrier metal 21 is not formed, between the interlayer insulating film 19 and the source electrode 23. The barrier metal 22 includes stepped surfaces, in the portions on which the barrier metal 21 is not formed. The stepped surface of the barrier metal 22 can relax the stress, and prevent the cracks produced by the thermal process of the barrier metal 22.

D. Embodiment 4

[D-1. Structure]

FIG. 1 also illustrates a plan view of a silicon carbide semiconductor device 104 according to Embodiment 4. The silicon carbide semiconductor device 104 according to Embodiment 4 also includes the two layers of the barrier metals 21 and 22 in the current sense pads 4a as the sense cell region, similarly to the cell region 1.

[D-2. Manufacturing Processes]

Figure 14:
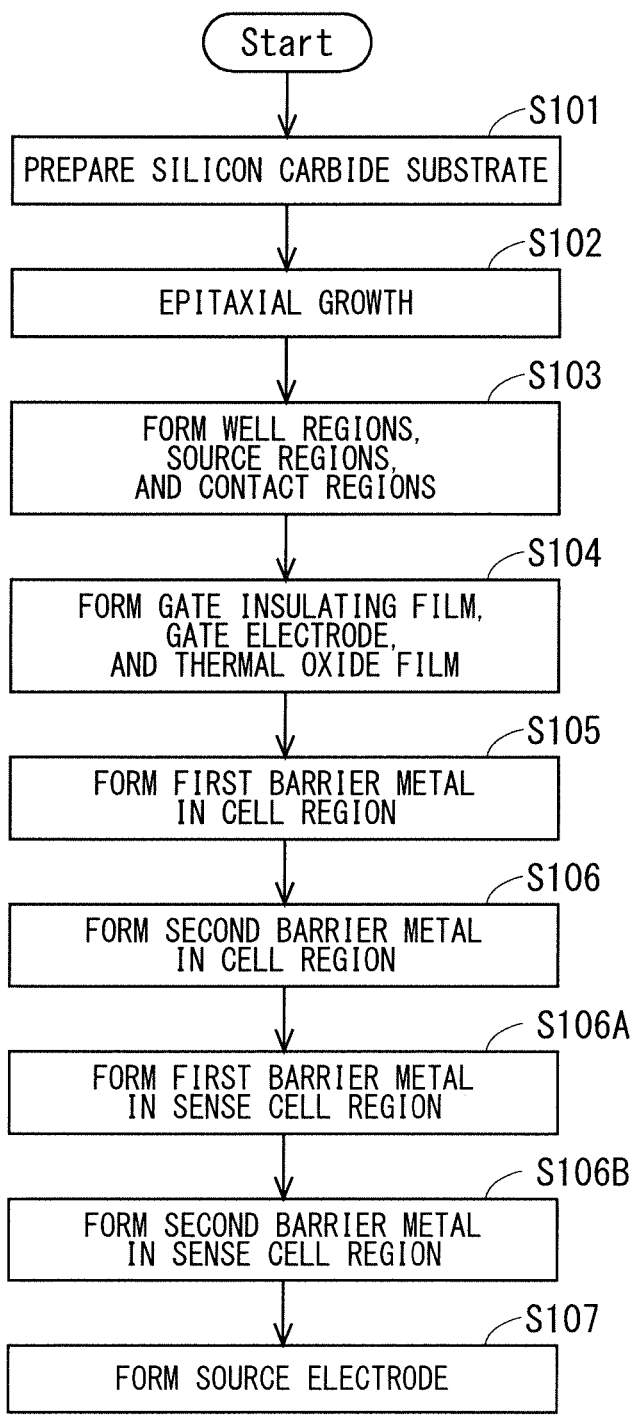
FIG. 14 is a flowchart illustrating manufacturing processes of a silicon carbide semiconductor device according to Embodiment 4.

FIG. 14 is a flowchart illustrating manufacturing processes of the silicon carbide semiconductor device 104 according to Embodiment 4. The manufacturing processes of the silicon carbide semiconductor device 104 according to Embodiment 4 will be described.

The processes until forming the barrier metal 22 of the upper layer in the cell region 1 (Steps S101 to S106) are identical to those according to Embodiment 1. After the barrier metal 22 of the upper layer is formed in the cell region 1, the barrier metal 21 of the lower layer is formed on the interlayer insulating film 19 and in the contact holes 19h in the sense cell region, similarly to the cell region 1 (Step S106A). Next, the barrier metal 22 of the upper layer is formed on the barrier metal 21 in the sense cell region (Step S106B). The following Step S107 is identical to that according to Embodiment 1.

[D-3. Advantages]

When the cell region 1 differs in threshold voltage from the sense cell region, accurate current detection is impossible in the sense cell region. Thus, appropriate overcurrent protection is impossible. However, the silicon carbide semiconductor device 104 according to Embodiment 4 also includes, in the sense cell region, the two layers of the barrier metals 21 and 22 that are made of the same metallic material. Specifically, the barrier metals 21 and 22 are formed between the interlayer insulating film 19 and the source electrode 23 in the sense cell region of the silicon carbide semiconductor device 104 according to Embodiment 4. This enables application of the same threshold voltage to the sense cell region and the cell region 1, and the accurate current detection.

The thickness and the material of the barrier metals 21 and 22 may differ between the sense cell region and the cell region 1. However, when the thickness and the material of the barrier metals 21 and 22 are consistent between the sense cell region and the cell region 1, the barrier metals can be simultaneously formed in the sense cell region and the cell region 1. This increases the productivity.

The MOSFET is described as an example semiconductor device in. Embodiments above. However, not only the MOSFET but also other semiconductor devices each having an element structure on a silicon carbide layer can apply the structures according to Embodiments above and produce the same advantages.

Some Embodiments of the present disclosure, which are described above, are presented as examples. Embodiments can be variously omitted, modified, or changed without departing from the spirit and scope of the disclosure. Embodiments can also be combined.

E. Embodiment 5

Embodiment 5 will describe a power converter to which the silicon carbide semiconductor devices 101 to 104 according to Embodiments above are applied. Application of the silicon carbide semiconductor devices 101 to 104 is not limited to specific power converters. Embodiment 5 will describe application of the silicon carbide semiconductor devices 101 to 104 to a three-phase inverter.

Figure 15:
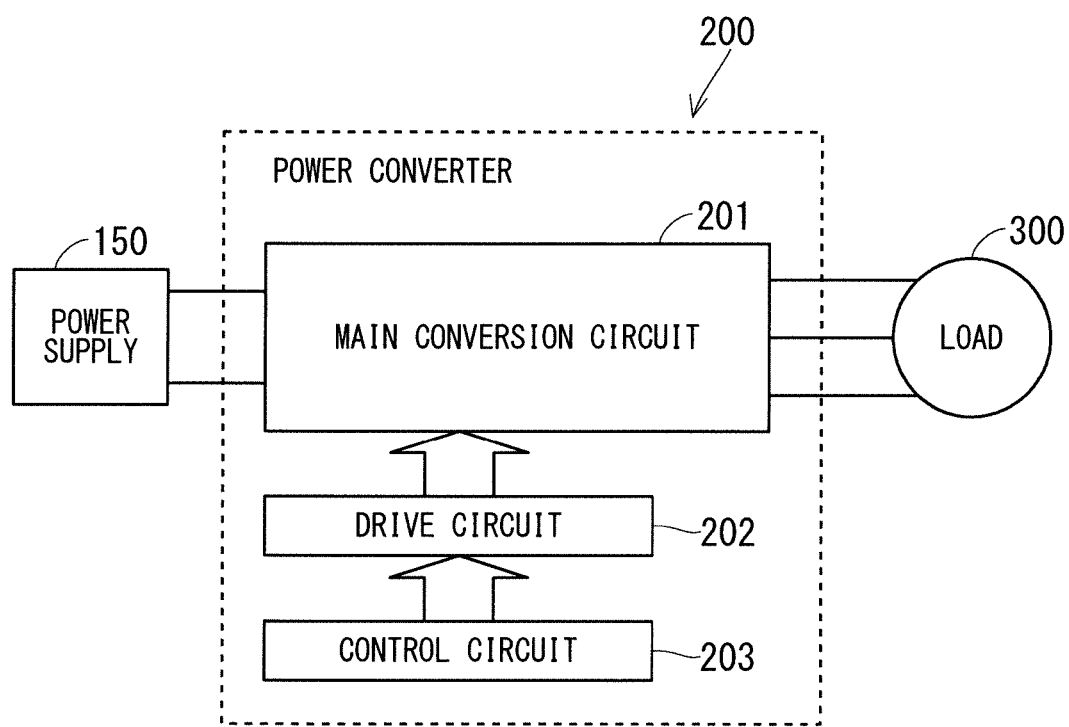
FIG. 15 is a block diagram illustrating a configuration of a power conversion system according to Embodiment 5.

FIG. 15 is a block diagram illustrating a configuration of a power conversion system to which the power converter according to Embodiment 5 is applied.

The power conversion system illustrated in FIG. 15 includes a power supply 150, a power converter 200, and a load 300. The power supply 150, which is a DC power supply, supplies a DC power to the power converter 200. The power source 150 may include various types of components such as a direct current system, a solar battery, or a rechargeable battery, and may include a rectifying circuit connected to an AC system or an AC/DC converter. The power source 150 may include a DC/DC converter which converts a DC power output from a DC system into a predetermined power.

The power converter 200, which is a three-phase inverter connected between the power source 150 and the load 300, converts the DC power supplied from the power source 150 into the AC power to supply the AC power to the load 300. As illustrated in FIG. 15, the power converter 200 includes a main conversion circuit 201 which converts the DC power to output the AC power, a drive circuit 202 which outputs a driving signal for driving each switching element in the main conversion circuit 201, and a control circuit 203 which outputs, to the drive circuit 202, a control signal for controlling the drive circuit 202.

The load 300 is a three-phase electrical motor driven by the AC power supplied from the power converter 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power converter 200 will be described in detail hereinafter. The main conversion circuit 201 includes switching elements and free-wheeling diodes (not shown). Switching of the switching element causes the DC power supplied from the power supply 150 to be converted into the AC power. The AC power is then supplied to the load 300. The specific circuit configuration of the main conversion circuit 201 is of various types. The main conversion circuit 201 according to Embodiment 5 is a three-phase full-bridge circuit having two levels, and includes six switching elements and six free-wheeling diodes anti-parallel connected to the respective switching elements. Any one of the silicon carbide semiconductor devices 101 to 104 according to Embodiments 1 to 4 is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates driving signals for driving the switching elements of the main conversion circuit 201, and supplies the driving signals to control electrodes of the switching elements of the main conversion circuit 201. Specifically, the drive circuit 202 outputs, to the control electrodes of the switching elements in accordance with the control signal from the control circuit 203 to be described later, the driving signal for switching the switching element to an ON state and the driving signal for switching the switching element to an OFF state. The driving signal is a voltage signal (ON signal) equal to or higher than a threshold voltage of the switching element when the switching element is kept in the ON state. The driving signal is a voltage signal (OFF signal) equal to or lower than the threshold voltage of the switching element when the switching element is kept in the OFF state.

The control circuit 203 controls the switching elements of the main conversion circuit 201 so that a desired power is supplied to the load 300. Specifically, the control circuit 203 calculates a time (ON time) when each of the switching elements of the main conversion circuit 201 should enter the ON state, based on the power to be supplied to the load 300. For example, the control circuit 203 can control the main conversion circuit 201 by performing PWM control for modulating the ON time of the switching elements in accordance with the voltage to be output. Then, the control circuit 203 outputs a control instruction (control signal) to the drive circuit 202 so that the drive circuit 202 outputs the ON signal to the switching element which should enter the ON state and outputs the OFF signal to the switching element which should enter the OFF state at each time. The drive circuit 202 outputs the ON signal or the OFF signal as the driving signal to the control electrode of each of the switching elements in accordance with this control signal.

Since any one of the silicon carbide semiconductor devices 101 to 104 according to Embodiments 1 to 4 is applied to each of the switching elements of the main conversion circuit 201 in the power converter according to Embodiment 5, the reliability can be enhanced.

Although Embodiment 5 describes the example of applying the silicon carbide semiconductor devices 101 to 104 according to Embodiments 1 to 4 to the three-phase inverter having the two levels, its application is not limited thereto. The silicon carbide semiconductor devices 101 to 104 according to Embodiments 1 to 4 can be applied to various power converters. Although Embodiment 5 describes the power converter having the two levels, the power converter may have three or multiple levels. The silicon carbide semiconductor devices 101 to 104 according to Embodiments 1 to 4 may be applied to a single-phase inverter when the power is supplied to a single-phase load. Moreover, the silicon carbide semiconductor devices 101 to 104 according to Embodiments 1 to 4 are also applicable to a DC/DC converter or an AC/DC converter when the power is supplied to, for example, a DC load.

The power converter to which the silicon carbide semiconductor devices 101 to 104 according to Embodiments 1 to 4 are applied is not limited to a power converter including a motor as the load. The power converter can also be used as a power-supply device of, for example, an electrical discharge machine, a laser beam machine, an induction heat cooking device, or a non-contact power feeding system, and can be further used as a power conditioner of, for example, a solar power system or an electricity storage system.

What is claimed is:

1. A silicon carbide semiconductor device, comprising:
a silicon carbide substrate;
a semiconductor layer formed on the silicon carbide substrate;
a gate electrode facing the semiconductor layer with a gate insulating film between the gate electrode and the semiconductor layer;
an interlayer insulating film covering the gate electrode and having portions directly contacting the semiconductor layer;
a barrier metal formed on the interlayer insulating film; and
a top electrode covering the barrier metal,
wherein the barrier metal has a two-layer structure of a first barrier metal and a second barrier metal, and
the first barrier metal that is closer to the interlayer insulating film than the second barrier metal in the barrier metal is made of a same metallic material as the second barrier metal, the first barrier metal being thinner than the second barrier metal, and the first barrier metal directly contacting a plurality of source regions and a contact region that is directly between the plurality of source regions.

2. The silicon carbide semiconductor device according to claim 1,
wherein a total thickness of the first barrier metal and the second barrier metal ranges between 100 nm and 200 nm.

3. The silicon carbide semiconductor device according to claim 1, further comprising
an oxide film between the first barrier metal and the second barrier metal.

4. The silicon carbide semiconductor device according to claim 1, comprising
a portion on which the first barrier metal is not formed, between the interlayer insulating film and the top electrode,
wherein the second barrier metal includes a stepped surface, in the portion on which the first barrier metal is not formed.

5. The silicon carbide semiconductor device according to claim 1,
wherein the first barrier metal and the second barrier metal are made of Ti or TiN.

6. The silicon carbide semiconductor device according to claim 1,
wherein the barrier metal is formed between the interlayer insulating film and the top electrode in a sense cell region.

7. A power converter, comprising:
a main conversion circuit including the silicon carbide semiconductor device according to claim 1, and converting an input power to output a resulting power;
a drive circuit outputting, to the silicon carbide semiconductor device, a driving signal for driving the silicon carbide semiconductor device; and
a control circuit outputting, to the drive circuit, a control signal for controlling the drive circuit.

8. The silicon carbide semiconductor device according to claim 1,
wherein an entirety of the contact region extends under a portion of the first barrier metal that extends in a direction along a surface of the semiconductor layer that the first barrier metal layer directly contacts.

9. A method for manufacturing a silicon carbide semiconductor device, the method comprising:
preparing a silicon carbide substrate;
forming a semiconductor layer on the silicon carbide substrate;
forming a gate electrode facing the semiconductor layer with a gate insulating film between the gate electrode and the semiconductor layer;
forming an interlayer insulating film covering the gate electrode and having portions directly contacting the semiconductor layer;
forming a first barrier metal on the interlayer insulating film;
forming, on the first barrier metal, a second barrier metal made of a same metallic material as the first barrier metal, the second barrier metal being thicker than the first barrier metal, and the first barrier metal directly contacting a plurality of source regions and a contact region that is directly between the plurality of source regions; and
forming a top electrode covering the second barrier metal.

10. The method according to claim 9,
wherein a total thickness of the first barrier metal and the second barrier metal ranges between 100 nm and 200 nm.

11. The method according to claim 9, further comprising forming an oxide film on the first barrier metal,
wherein forming of the second barrier metal is forming the second barrier metal on the first barrier metal with the oxide film between the first barrier metal and the second barrier metal.

12. The method according to claim 9,
wherein the first barrier metal and the second barrier metal are made of Ti or TiN.

13. The method according to claim 9,
wherein an entirety of the contact region extends under a portion of the first barrier metal that extends in a direction along a surface of the semiconductor layer that the first barrier metal layer directly contacts.

* * * * *